(12) United States Patent
Farquhar et al.

(10) Patent No.: US 6,843,929 B1
(45) Date of Patent: Jan. 18, 2005

(54) ACCELERATED ETCHING OF CHROMIUM

(75) Inventors: Donald S. Farquhar, Endicott, NY (US); Edmond O. Fey, Vestal, NY (US); Elizabeth Foster, Friendsville, PA (US); Michael J. Klodowski, Endicott, NY (US); Paul G. Rickerl, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/514,526

(22) Filed: Feb. 28, 2000

(51) Int. Cl.$^7$ ................................................ B44C 1/22
(52) U.S. Cl. ...................... 216/100; 216/108; 216/109; 205/640; 205/666; 205/667; 205/670; 205/674; 252/79.2
(58) Field of Search ................................ 216/100, 108, 216/109; 205/640, 666, 667, 670, 674; 252/79.2

(56) References Cited

U.S. PATENT DOCUMENTS

| | | | |
|---|---|---|---|
| 3,539,408 A | | 11/1970 | Cashau et al. |
| 3,616,349 A | | 10/1971 | Szupillo |
| 3,630,795 A | | 12/1971 | Vorie |
| 4,105,468 A | * | 8/1978 | Geshner et al. ............... 134/28 |
| 4,139,465 A | * | 2/1979 | Nordengren ................. 210/772 |
| 4,160,691 A | * | 7/1979 | Abolafia et al. ............. 156/654 |
| 4,247,377 A | * | 1/1981 | Eckler et al. .......... 204/129.65 |
| 4,279,715 A | * | 7/1981 | Arora et al. ............. 204/129.9 |
| 4,344,223 A | * | 8/1982 | Bulger et al. ................ 205/124 |
| 4,350,564 A | * | 9/1982 | Wei ............................. 438/754 |
| 4,366,034 A | * | 12/1982 | Ricks et al. ................. 205/216 |
| 4,370,197 A | * | 1/1983 | Abolafia et al. ........ 156/659.13 |
| 4,405,709 A | * | 9/1983 | Katano et al. .............. 430/307 |
| 4,437,926 A | * | 3/1984 | Barnabe ..................... 156/654 |
| 4,588,471 A | * | 5/1986 | Griffith et al. .............. 156/652 |
| 4,642,168 A | * | 2/1987 | Imai ........................... 205/645 |
| 4,699,811 A | * | 10/1987 | Kunces ....................... 427/259 |
| 5,149,404 A | * | 9/1992 | Blonder et al. ............. 205/656 |
| 5,641,391 A | | 6/1997 | Hunter et al. |
| 5,733,432 A | * | 3/1998 | Williams et al. ............ 205/657 |
| 6,228,687 B1 | * | 5/2001 | Akram et al. ............... 438/125 |

OTHER PUBLICATIONS

"Process Considerations in the Fabrication of Teflon Printed Circuit Boards", by Light et al, 1994 Proceedings, 44 Electronic Components & Technology Conference, 5/94.

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

IBM Technical Disclosure Bulletin, Etchability of Chromium Films, R. G. Frieser, vol. 13, No. 4, Sep. 1970.

Electroplating, Frederick A. Lowenheim, pp. 27–45, Chapter 3–Corrosion, McGraw–Hill, Book Company.

* cited by examiner

Primary Examiner—Michael Barr
Assistant Examiner—Gentle E. Winter
(74) Attorney, Agent, or Firm—Schmeiser,Olsen & Watts; William H. Steinberg

(57) ABSTRACT

A method and associated structure for increasing the rate at which a chromium volume is etched when the chromium body is contacted by an acid solution such as hydrochloric acid. The etch rate is increased by a metallic or steel body in continuous electrical contact with the chromium volume, both of which are in continuous contact with the acid solution. At a temperature between about 21° C. and about 52° C., and a hydrochloric acid concentration (molarity) between about 1.2 $\underline{M}$ and about 2.4 $\underline{M}$, the etch rate is at least a factor of about two greater than an etch rate that would occur in an absence of the steel body. In one embodiment, the chromium volume is a chromium layer that rests upon a conductive layer that includes a metal such as copper, wherein the acid solution is not in contact with the conductive layer. In another embodiment, the chromium volume is a chromium layer located under a conductive layer that includes a metal such as copper, wherein the steel body and the acid solution both contact the chromium layer through an opening in the conductive layer such that the opening exposes the chromium layer.

20 Claims, 2 Drawing Sheets

US 6,843,929 B1

ACCELERATED ETCHING OF CHROMIUM

BACKGROUND OF THE INVENTION

1. Technical Field

The present invention relates to a method and associated structure for increasing the rate at which chromium is etched when contacted by an acid solution.

2. Related Art

An etching of a chromium volume or chromium layer may be required during fabrication of a multilayer semiconductor structure such as a chip carrier. In some applications, a layer of photoresist covers portions of the chromium volume in order to produce a specified pattern. Further, a portion of the chromium volume must be removed using a chemical etchant, while at the same time leaving areas of the photoresist intact. The chemical etchant must have the property of removing all or part of the chromium volume while not attacking the photoresist. One etchant that meets this requirement is hydrochloric acid (HCl).

Known etching processes utilize a dip tank process for etching chromium from a laminated panel. However, horizontal conveyorized spray processing equipment offers greater throughput and better integration with the rest of the manufacturing operation. Some special needs arise in conveyorized processing. For instance, some laminated panels (i.e., thin ones) need to be set into a carrier fixture for processing. Also, one of the techniques used to increase etch rate in dip processes, the addition of a relatively high concentration of chloride salt, is not practical in a conveyorized spray process because of nozzle clogging and accumulation of salts throughout the apparatus.

A second problem associated with the related art is known as "undercut," wherein some edges of the layer of photoresist are undermined by the acid solution when the solution is left in contact with the chromium volume for excessively long periods of time required to produce the necessary amount of etching.

Thus there exists the need for a method to enhance the chromium volume etch rate so that the etch rate will keep pace with the remainder of the conveyorized process. There also exists a need for accelerating the chromium etch rate so that the undercutting of photoresist layers is minimized or eliminated by minimizing the total time that the panel spends in contact with the etching solution.

SUMMARY OF THE INVENTION

The present invention provides a method for increasing a rate at which a chromium volume is etched, said method comprising: providing said chromium volume that includes chromium, said chromium volume continuously contacted by an acid solution; and said chromium layer in continuous electrical contact with a metallic body, wherein the metallic body is continuously contacted by said acid solution; and etching the chromium volume.

The present invention provides an electrical structure, comprising: a chromium volume; an iron-comprising body in continuous electrical contact with the chromium volume; and an acid solution in continuous contact with both the chromium volume and the iron-comprising body, wherein the chromium body is being etched at an etch rate.

The disclosed method advantageously increases the etch rate of the chromium volume when contacted by an acid solution, such as in a spray etch process. By increasing the etch rate, the present invention also alleviates the problem called "undercut," wherein chromium is etched away from underneath the photoresist. Undercutting occurs when the etchant (i.e., the acid solution) is permitted to have excessive contact with the chromium.

The foregoing and other features and advantages of the invention will be apparent from the following more particular description of preferred embodiments of the invention.

DETAILED DESCRIPTION OF THE INVENTION

Figure 1:
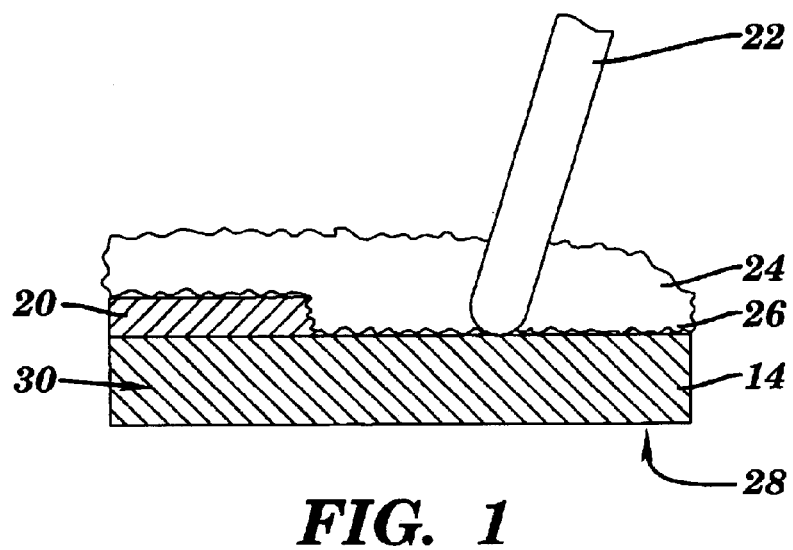
FIG. 1 depicts a cross-sectional elevational view of a chromium body, a metallic body, and an acid solution, all in continuous mutual contact, in accordance with preferred embodiments of the present invention.

FIG. 1 illustrates a cross-sectional elevational view of a chromium volume 14, a metallic or iron-comprising body 22, and an acid solution 24, all in continuous mutual contact, the metallic body 22 also in continuous electrical contact with the chromium volume 14, in accordance with preferred embodiments of the present invention. The acid solution 24 is shown in FIG. 1 as a spray-deposited coating on a first surface 26 of the chromium volume 14, but may be in any other form, such as in an immersion bath, so long as the acid solution 24 maintains continuous contact with both the chromium volume 14 and the metallic body 22. Alternatively, the acid solution 24 may be applied to a second surface 28 of the chromium volume 14, or to any exposed side 30 of the chromium volume 14. Note that a chromium oxide layer 20 may exist on the chromium volume 14, because the chromium volume 14 is prone to being oxidized by exposure to air. The metallic body 22 preferably includes steel.

An acid solution 24 that is effective for etching chromium includes a hydrochloric acid (HCl) solution having a molar concentration (i.e., molarity, $\underline{M}$) of at least about 0.3. Preferably, the molar concentration should not exceed about 6. At molar concentrations above about 6, care should taken to limit the etch time to a value low enough to insure that the etchant does not "undercut" any barrier material or photoresist, if present, such as a photoresist (not shown) above the chromium volume 30 or the chromium oxide layer 20. The acid solution 24 should preferably be applied to the chromium volume at a temperature of at least about 35° C. to ensure a sufficiently high rate of etching. The temperature is preferably below about 70° C. At temperatures above about 70° C. and below the boiling point of the acid solution 24, the etch time should be sufficiently low so as to avoid the same undercutting as was described above for molar concentrations exceeding about 6. At temperatures above about 70° C. and near or at the boiling point of the acid solution 24, care must taken to replenish evaporative losses of the acid solution 24. Within these parameters such that the acid solution 24 includes hydrochloric acid and the metallic body 22 includes steel, etching rates between about 300 Å/min and about 3200 Å/min can be expected.

Etch rate tests have been conducted for chromium samples of thickness 800 Å such that the acid solution 24 includes hydrochloric acid and the metallic body 22 includes steel, with the temperature varying between about 21° C. and about 52° C., and the hydrochloric acid solution's molarity ($\underline{M}$) varying between about 1.2 $\underline{M}$ and about 2.4 $\underline{M}$. The tests were conducted in the absence of NaCl in the acid solution. The results are summarized in Table 1 which follows.

TABLE 1

| Temp. (° C.) | HCl Conc.* (M) | Stirring | Sparging | Etch Rate (Å/sec) | Etch Rate Ratio (w/ to w/o body 22) |
|---|---|---|---|---|---|
| 52 | 1.2 | Yes | Yes | 16.0 | 15.5 |
| 52 | 1.2 | No | No | 7.6 | 13.6 |
| 21 | 2.4 | No | No | 4.9 | 5.8 |
| 52 | 2.4 | Yes | No | 53.3 | 2.3 |
| 52 | 2.4 | No | Yes | 53.3 | 2.0 |

*Note: Concentration of the HCl solution is its molarity (moles/liter).

The preceding table shows that the etch rate resulting from the of metallic body 22 is at least a factor of about two greater than an etch rate that would occur in an absence of the metallic body 22, which provides a substantial increase in etch rate as compared with currently known methods of etching chromium. As shown in Table 1, the etch rate ratio may be as high as about 15 if the temperature is high (i.e., about 52° C.) and the HCl concentration is low (i.e., about 1.2 $\underline{M}$). The entries under "Stirring" indicate whether or not the acid solution was stirred during the entire time that the acid solution was applied to the chromium test sample. Similarly, the entries under "Sparging" indicate th at this technique (i.e., forcing nitrogen gas ($N_2$) to bubble through the acid solution so as to sweep away air in order to reduce the amount of dissolved oxygen in the acid solution) was utilized for the entire time that the acid solution was in contact with the chromium test sample. Nitrogen sparging also has the effect of mixing the solution and is thus similar to stirring, with the additional effect of sweeping out the dissolved oxygen.

Note that the etch rate ratio, which is an indicator of the extent to which the present invention represents an improvement over currently known methods, is generally not very sensitive to stirring and sparging. An exception occurs when the temperature is low (i.e., about 21° C.) and the HCl concentration is high (i.e., about 2.4 $\underline{M}$), such that there should be no stirring and no sparging in order to achieve the etch rate ratio shown.

Figure 4:
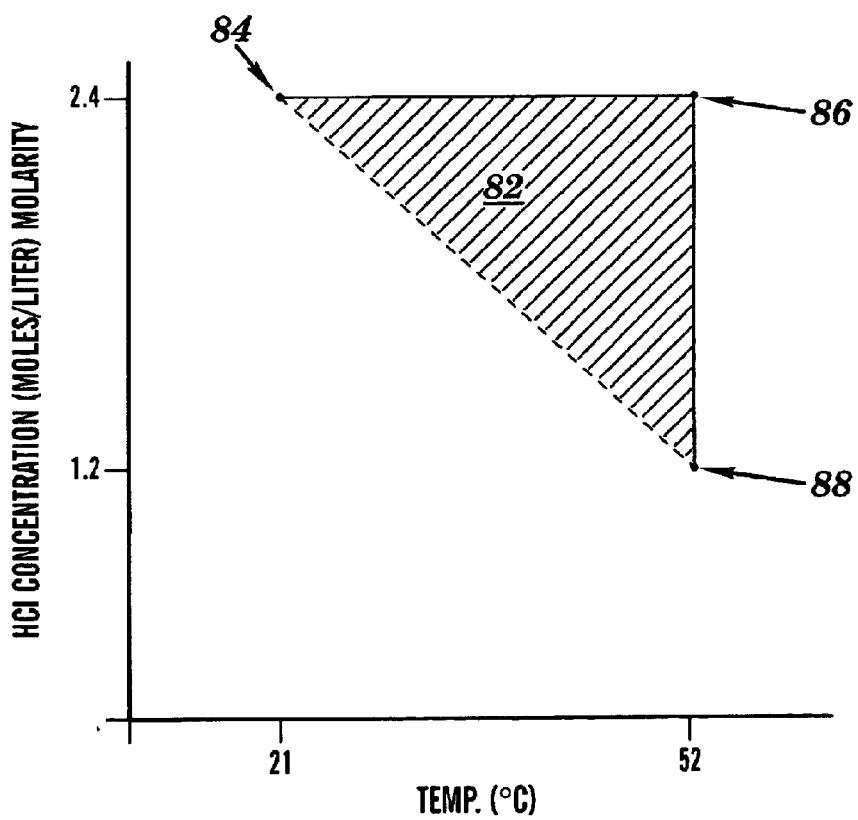
FIG. 4 depicts a region of optimum operation of the method of the present invention, the region being defined by specific combinations of temperature and acid solution concentration.

FIG. 4 shows a domain of temperature and HCl concentration over which Table 1 applies. The present invention shows marked improvement in the chromium etch rate for those combinations of temperature (T) and HCl concentration or molarity ($\underline{M}$) parameters which fall within the triangular region 82. Triangular region 82 is defined by points 84, 86, and 88, having the following temperature (° C.) and molarity ($\underline{M}$) coordinates (T,M): point 84 (21° C., 2.4 $\underline{M}$); point 86 (52° C., 2.4 $\underline{M}$); point 88 (52° C., 1.2 $\underline{M}$).

Other tests conducted in a conveyor spray etching apparatus, maintained at about 55° C., indicated that the chromium volume was completely etched away when the sample was about fifty-five percent of the way through the apparatus, when a steel clip was attached to the chromium volume. Without the steel clip, the chromium volume was barely etched by the time the sample reached the end of the spray etching conveyor. These results again indicate an improvement in the etch rate of about two to one using a metallic body (i.e., a steel clip) to accelerate the chromium etch rate versus not using the metallic body.

The mechanism for the increased etch rate facilitated by the metallic body 22 is as follows. An etching of chromium involves an oxidation reaction which ionizes a chromium atom, resulting in a positive chromium ion such as $Cr^{+3}$ and free electrons. The chromium ion passes into the acid solution where it forms a chemical complex with the negative ion of the acid within the acid solution 24 such as with $Cl^-$ of HCl. The free electrons react with hydrogen ions of the acid solution 24 to form hydrogen gas according to: $2H^+ + 2e^- \rightarrow H_2$. The metallic body 22 serves to enhance electron transfer from the chromium to the acid solution 24; i.e., the electrons flow more readily through the metallic body 22 than from the chromium directly to the acid solution 24. The preceding explanation is supported by observations of hydrogen gas at steel surfaces for tests in which the metallic body 22 includes steel and the acid solution 24 includes hydrochloric acid.

It must be emphasized that the aforementioned increase in etch rate obtained with the present invention requires that, throughout the period during which the chromium volume 14 is etched, the metallic body 22 must be in continuous electrical contact with the chromium volume 14 and the acid solution 24. Should the metallic body 22 be removed from its contact with either the metallic body 22 or the acid solution 24, the etch rate will diminish appreciably.

The presence of a chromium oxide layer 20 on the chromium volume 14 does not inhibit the increased chromium etch rate of the present invention. Moreover, a given chromium volume 14 may be etched until it is effectively removed in toto, or the chromium volume 14 may be etched until a desired thickness is reached.

Although the acid solution 24 preferably includes hydrochloric acid, the acid solution 24 may generally include an acid from the halogen family of elements of the form HX, wherein X is fluorine, chlorine, bromine, or iodine.

Figure 2:
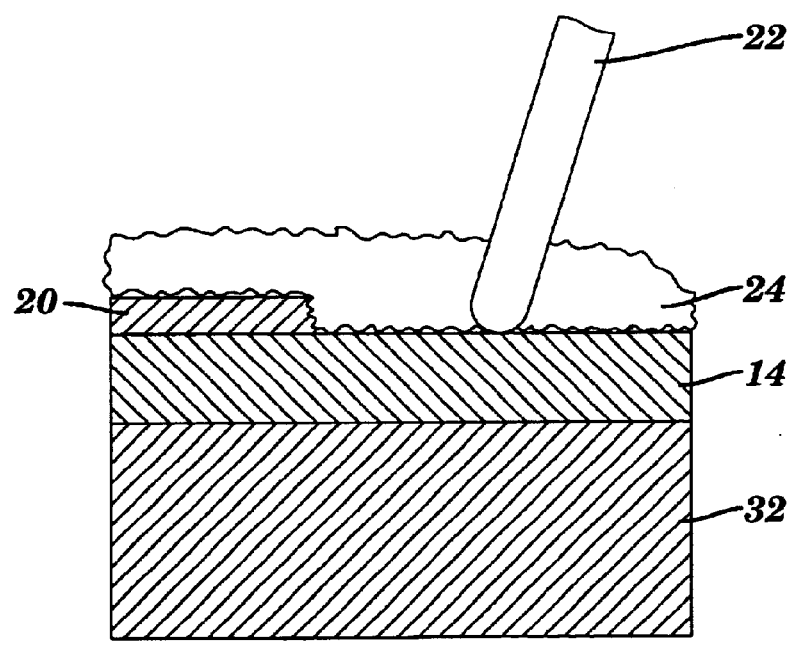
FIG. 2 depicts FIG. 1 after a layer of conductive metal has been conductively coupled to the chromium body, such that the layer of conductive metal is not in contact with either the metallic body or the acid solution.

FIG. 2 illustrates FIG. 1 after a layer of conductive metal 32 (e.g., copper, aluminum, nickel, silver, gold) is conductively coupled to the chromium body 14, such that the layer of conductive metal 32 is not in contact with either the metallic body 22 or the acid solution 24. As described supra in conjunction with FIG. 1, the chromium etching process is enhanced by use of the metallic body 22. As an application of FIG. 2, the layer of conductive metal 32 may function as a continuous internal sheet of conductive metal with the chromium body 14 serving as an adhesive interface between the layer of conductive metal 32 and a subsequently applied layer of dielectric material. In order to form through holes through a multilayered interconnect structure (e.g., a chip carrier) a hole must be etched in the chromium body 14 as well as in the layer of conductive metal 32. The present invention, with inclusion of the metallic body 22 as described supra, enables the holes in the chromium body 14 to be formed with a high rate of etching.

Figure 3:
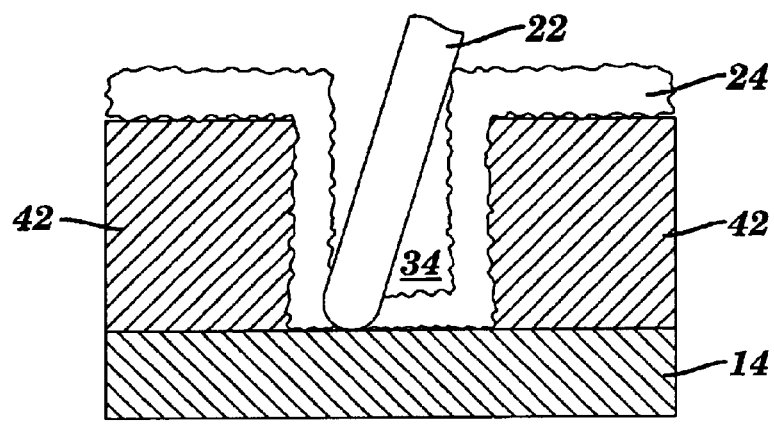
FIG. 3 depicts FIG. 1 after conductively coupling a layer of conductive metal to the chromium body, such that the metallic body and the acid solution each contact the chromium body through an opening within the layer of conductive metal.

FIG. 3 illustrates an alternative embodiment of the present invention. FIG. 3 illustrates FIG. 1 after a layer of conductive metal 42 (e.g., copper, aluminum, nickel, silver, gold) is conductively coupled to the chromium body 14, such that the metallic body 22 and the acid solution 24 each contact the chromium body 14 through an opening 34 within the layer of conductive metal 42. Here, the chromium volume 14 is formed beneath the layer of conductive metal 42 (e.g., copper or aluminum). The opening 34 in the layer of conductive metal 42, which extends through the thickness of the conductive metal 42, may be fabricated using techniques known in the art. As described supra in conjunction with FIG. 1, the chromium etching process is enhanced by use of the metallic body 22. As an application of FIG. 3, the layer of conductive metal 42 may function as a continuous surface sheet of conductive metal with the chromium body 14 serving as an adhesive interface between the layer of conductive metal 42 and a layer (not shown) of dielectric material (e.g., a fluoropolymer dielectric) of a substrate to which the layer of conductive metal is to be affixed for forming surface conductive circuit lines. The layer of conductive metal 42 and the chromium body 14 must be etched in order to insulatively separate distinct circuit line segments within the layer of conductive metal 42. The present invention, with inclusion of the metallic body 22 as described supra, facilitates etching of the chromium body 14 at a high rate.

Further alternative embodiments suggested by FIG. 3 include the use of multiple openings 34 and a corresponding number of metal bodies 22. Each metallic body 22 will contact a unique chromium volume 14 or a portion thereof. Such multiple chromium volumes 14 are electrically isolated from one another.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electrical structure, comprising:
    a chromium volume, wherein the chromium volume includes a layer or chromium;
    an iron-comprising body;
    an acid solution; and
    a layer of conductive metal on the layer of chromium, wherein the conductive metal includes an opening extending through its thickness, wherein a portion of the iron-comprising body is within the opening, wherein the portion of the iron-comprising body is in electrical contact with the chromium volume, and wherein a portion of the acid solution is within the opening, and wherein the portion of the acid solution is in contact with both the portion of the iron-comprising body and the chromium volume.

2. The electrical structure of claim 1, wherein the electrical structure further comprises a chromium oxide layer on the chromium volume.

3. The electrical structure of claim 1, wherein the acid solution includes hydrochloric acid in a liquid bath form.

4. The electrical structure of claim 1, wherein the acid solution includes hydrochloric acid in a spray form.

5. The electrical structure of claim 1, wherein said iron-comprising body includes steel.

6. The electrical structure of claim 1, wherein the layer of conductive metal includes a metal selected from the group consisting of copper, aluminum, nickel, silver, and gold.

7. The electrical structure of claim 1, wherein the iron-comprising body includes steel, and wherein the chromium volume includes the metallic chromium.

8. The electrical structure of claim 1, wherein the chromium volume includes the metallic chromium, wherein the acid solution includes hydrochloric acid, and wherein a temperature (T) and a molarity ($\underline{M}$) of the hydrochloric acid is within a triangular space defined by (T,M) points of (21° C., 2.4 $\underline{M}$), (52° C., 2.4 $\underline{M}$), and (52° C., 1.2 $\underline{M}$).

9. The electrical structure of claim 1, further comprising a fluoropolymer dielectric volume bonded to said chromium volume.

10. The electrical structure of claim 1, wherein the acid solution is adapted to etch metallic chromium at a first etch rate in an absence of any present or prior contact between the metallic chromium and a body that includes iron.

11. The electrical structure of claim 10, wherein the acid solution is adapted to etch the chromium volume at a second etch rate that exceeds the first etch rate.

12. An electrical structure, comprising:
    a chromium volume;
    an iron-comprising body in electrical contact with the chromium volume;
    an acid solution in contact with both the chromium volume and the iron-comprising body, wherein the acid solution is adapted to etch metallic chromium at a first etch rate in an absence of any present or prior contact between the metallic chromium and a body that includes iron, further comprising a layer of conductive metal, wherein the chromium volume includes a layer of chromium, and wherein the layer of chromium is one the layer of conductive metal.

13. The electrical structure of claim 12, wherein the electrical structure further comprises a chromium oxide on the chromium volume.

14. The electrical structure of claim 12, wherein the acid solution is not in contact with the layer of conductive metal.

15. The electrical structure of claim 14, wherein the layer of conductive metal includes a metal selected from the group consisting of copper, aluminum, nickel, silver, and gold.

16. The electrical structure of claim 12, wherein the chromium volume includes the metallic chromium, wherein the acid solution includes hydrochloric acid, wherein a temperature (T) and a molarity ($\underline{M}$) of the hydrochloric acid is within a triangular space defined by (T,M) points of (21° C., 2.4 $\underline{M}$), (52° C., 2.4 $\underline{M}$), and (52° C., 1.2 $\underline{M}$).

17. The electrical structure of claim 12, further comprising a fluoropolymer dielectric volume bonded to said chromium volume.

18. The electrical structure of claim 12, wherein the acid solution is adapted to etch the chromium at a second etch rate that exceeds the first etch rate.

19. An electrical structure, comprising:
    a chromium volume;
    an iron-comprising body in electrical contact with the chromium volume;
    an acid solution in contact with both the chromium volume and the iron-comprising body; and
    a layer of conductive metal, wherein the chromium volume includes a layer of chromium, and wherein the layer of chromium is on the layer of conductive metal and in direct mechanical contact with the layer of conductive metal.

20. The electrical structure of claim 19, wherein the acid solution is not in contact with the layer of conductive metal.

* * * * *